United States Patent
Yu et al.

(10) Patent No.: US 6,977,218 B2
(45) Date of Patent: Dec. 20, 2005

(54) METHOD FOR FABRICATING COPPER INTERCONNECTS

(75) Inventors: Chen-Hua Yu, Keelung (TW); Horng-Huei Tseng, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 22 days.

(21) Appl. No.: 10/621,676

(22) Filed: Jul. 17, 2003

(65) Prior Publication Data
US 2005/0014360 A1  Jan. 20, 2005

(51) Int. Cl.⁷ .......................................... H01L 21/4763
(52) U.S. Cl. ........................ 438/633; 438/628; 438/644
(58) Field of Search ............................. 438/633, 628, 438/644, 654, 687, 692, 759, 831, 833, 643, 438/653, 693

(56) References Cited

U.S. PATENT DOCUMENTS

| | | | |
|---|---|---|---|
| 4,910,169 A * | 3/1990 | Hoshino ..................... 438/660 |
| 5,447,887 A | 9/1995 | Filipiak et al. ............. 437/200 |
| 5,693,563 A * | 12/1997 | Teong ........................ 438/627 |
| 6,153,523 A * | 11/2000 | Van Ngo et al. ............ 438/687 |
| 6,211,084 B1 * | 4/2001 | Ngo et al. .................. 438/687 |
| 6,261,952 B1 * | 7/2001 | Ngo et al. .................. 438/687 |
| 6,335,283 B1 * | 1/2002 | Ngo et al. .................. 438/687 |
| 6,339,025 B1 * | 1/2002 | Liu et al. .................... 438/687 |
| 6,429,128 B1 * | 8/2002 | Besser et al. ............... 438/687 |
| 6,472,755 B1 * | 10/2002 | Ngo et al. .................. 257/762 |
| 6,492,266 B1 * | 12/2002 | Ngo et al. .................. 438/687 |
| 6,521,523 B2 | 2/2003 | Lee et al. ................... 438/633 |
| 6,596,631 B1 * | 7/2003 | Ngo et al. .................. 438/653 |
| 6,680,249 B2 * | 1/2004 | Lu et al. ..................... 438/653 |

OTHER PUBLICATIONS

Taiwan Patent Office Search Report.

* cited by examiner

Primary Examiner—Laura M Schillinger
(74) Attorney, Agent, or Firm—Thomas, Kayden, Horstemeyer & Risley

(57) ABSTRACT

A method for capping copper or copper alloy interconnects. A dielectric layer is formed overlaying a semiconductor substrate. An opening is formed in the dielectric layer and subsequently embedded copper or copper alloy form an interconnect structure. A silicon layer is formed on the copper or copper alloy by sputtering or chemical vapor deposition. A copper silicide layer is formed by reacting the silicon layer with the underlying copper or copper alloy as a capping layer.

14 Claims, 3 Drawing Sheets

METHOD FOR FABRICATING COPPER INTERCONNECTS

BACKGROUND OF THE INVENTION

1. Field of the Invention

The present invention relates to semiconductor fabrication, and in particular to methods for capping copper interconnects in semiconductor devices.

2. Description of the Related Art

Conventional semiconductor devices comprise conductive interconnects to establish electric contact with conductive structures inside semiconductor substrates. Interconnects comprise metal lines and metal plugs formed in dielectric layers for horizontal and vertical connections.

High performance semiconductor applications require rapid speed in semiconductor circuitry. The speed of semiconductor circuitry varies inversely with the resistance and capacitance of the interconnection pattern. As integrated circuits become more complex and feature size and space become smaller, the integrated circuit speed becomes more dependent upon the interconnect pattern, and thus, materials utilized in interconnect structures have become a major concern.

One approach to increase the control speed of semiconductor circuitry is to reduce the resistance of interconnects. Cu and Cu alloys are utilized as a better material for replacing Al in VLSI interconnect metallization. Cu exhibits superior electromigration properties and has a lower resistivity than Al. In addition, copper or copper alloy interconnects can be formed by electroless plating and electroplating, which is low cost, has high throughput, high quality, is highly efficient and has good filling capabilities.

Although Cu or Cu alloy interconnects have superior properties for applications, there are drawbacks in Cu implementation. For example, Cu readily diffuses into dielectric layers, particularly silicon dioxide, which results in electrical shorts.

A well-known solution to prevent Cu diffusion is to form diffusion barrier layers between Cu or Cu alloy interconnects and dielectric layers. Conventional diffusion barrier layers include tantalum (Ta)/tantalum nitride (TaN), titanium nitride (TiN), titanium-tungsten (TiW), tungsten (W)/tungsten nitride (WN) for encapsulating Cu interconnects. The diffusion barrier layers are usually deposited on bottoms and sidewalls of damascene openings by sputtering before Cu filling. The surface of exposed Cu or Cu alloy interconnects after planarization are conventionally capped by silicon nitride.

The drawback of silicon nitride is poor adhesion to copper. The subsequent process usually causes silicon nitride to peel away from the copper plugs. The peeled silicon nitride creates a path for copper to diffuse outward and for moisture or contaminates to diffuse inward and thus degrade reliability of the interconnects.

In U.S. Pat. No. 5,447,887, the adhesion problem of a silicon nitride capping layer to a copper interconnect is addressed by initially treating the exposed surface with silane in the absence o fa plasma to form a thin layer of copper silicide, and depositing a silicon nitride capping layer thereon.

U.S. Pat. No. 6,492,266 discloses enhancing the adhesion of a diffusion barrier or capping layer to a Cu or Cu alloy interconnect member by treating the exposed surface of the Cu or Cu alloy interconnect member: (a) under plasma conditions with ammonia and silane or dichlorosilane to form a copper silicide layer thereon; or (b) with an ammonia plasma followed by reaction with silane or dichlorosilane to form a copper silicide layer thereon.

U.S. Pat. No. 6,339,025 discloses fabricating a copper capping layer by forming a silicon rich nitride layer on an exposed copper layer. The silicon in the silicon rich nitride layer easily reacts with the copper and a copper silicide layer is formed between the copper and the silicon rich nitride layer.

SUMMARY OF THE INVENTION

The present invention provides methods to form copper silicide as a capping layer of copper interconnects.

In one embodiment, a dielectric layer is formed overlaying a semiconductor substrate. An opening is formed in the dielectric layer and subsequently embedded copper or copper alloy to form a interconnect structure. A silicon layer is formed on the copper or copper alloy by sputtering or chemical vapor deposition. A copper silicide layer is formed by reacting the silicon layer with the underlying copper or copper alloy as a capping layer.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
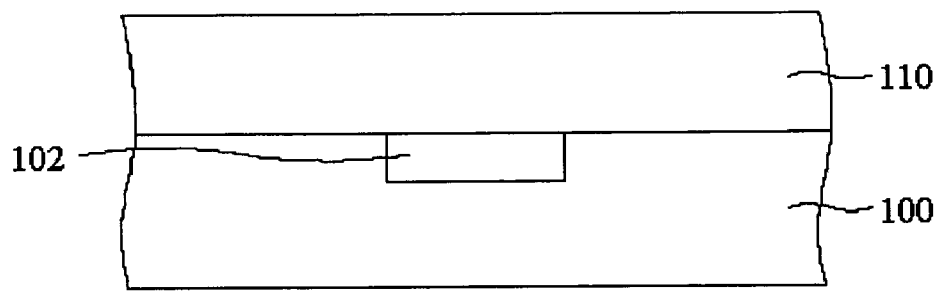
FIGS. 1A to 1G are cross-sections illustrating fabrication of a copper silicide layer capping on a copper interconnect.

In FIG. 1A, a semiconductor substrate 100 is provided with a conductive structure 102 thereon, such as a gate electrode or a metal line. A dielectric layer 110 is deposited overlying the semiconductor substrate 100. The preferred dielectric layer 110 is low-k material ($k \leq 3.2$), such as organic low-k material, CVD low-k material, or a combination thereof. The dielectric layer can also be fluorinated silica glass (FSG), SiC, SiOC, SiOCN, carbon-containing silicon oxide or nitrogen-containing silicon oxide.

Figure 1B:
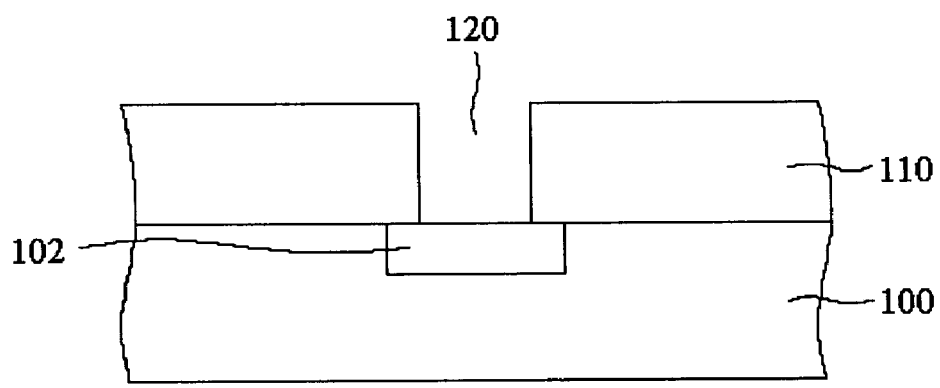

A damascene opening 120 is subsequently formed within the dielectric layer 110 to expose the underlying conductive structure 102 as shown in FIG. 1B. The preferred width of the opening 120 is less than 900 Å. Preferably, the opening 120 is defined by a conventional dual damascene process to form a trench and a via opening.

Figure 1C:
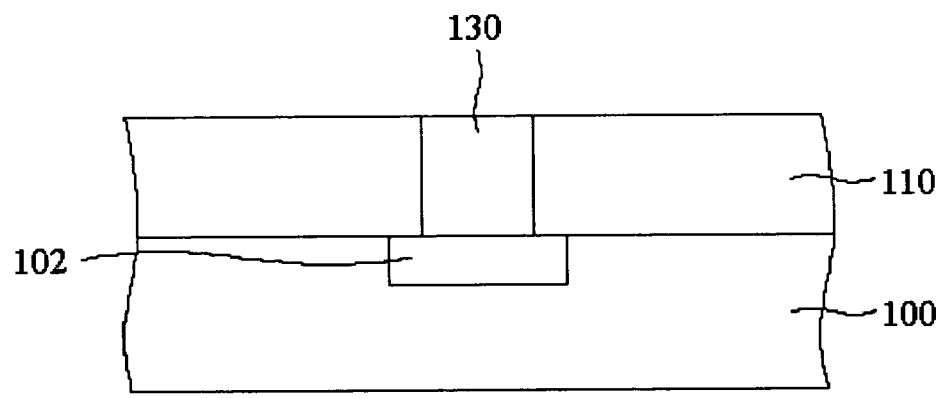

The opening 120 is filled with copper or copper alloy to form a copper plug 130, as FIG. 1C shows. In one embodiment, a diffusion barrier layer (not shown), e.g. TaN, TiN or TiW, is formed on the bottom and sidewall of the opening 120 by sputtering to block cupper diffusion into the dielectric layer. A copper seed layer (not shown) is subsequently formed on the opening 120, and then copper or copper alloy is embedded into the opening 120 by electro-chemical plating or electroless plating. In another embodiment, the opening 120 is filled with copper or copper alloy by chemical vapor deposition (CVD). The extra copper or copper alloy over the dielectric layer 110 is removed by planarization, such as by chemical mechanical polishing, to form a copper plug 130 as FIG. 1C shows. The preferred thickness of the copper or copper alloy plug 130 is less than 4000 Å.

Figure 1D:
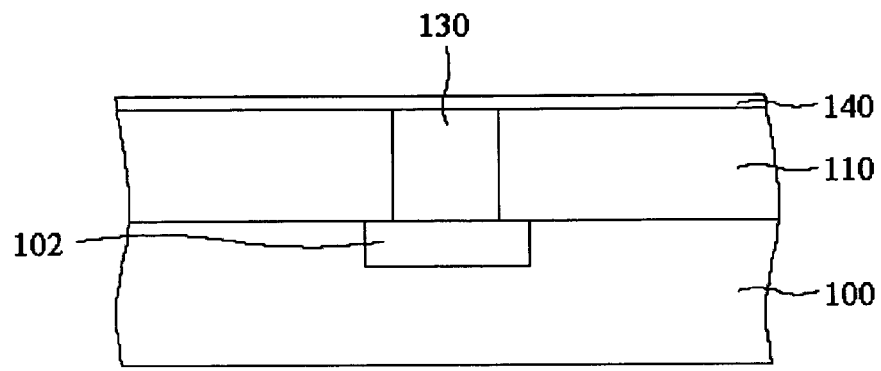

A silicon layer 140 is formed overlying the surface of the copper plug 130 and the dielectric layer 110 as shown in FIG. 1D. In a preferred embodiment, an amorphous silicon layer is deposited on the surface of the substrate 110 by sputtering, wherein the substrate 110 is attached to one electrode, and a target of silicon is placed on a second electrode. These electrodes are connected to a high voltage power supply and a gas which is usually a mixture of argon, and hydrogen is introduced between the electrodes to provide a medium in which a glow discharge or plasma can be initiated and maintained. The glow discharge provides ions that strike the silicon target, causing removal by momentum transfer of the mainly neutral target atoms, which subsequently condense as a thin film on the substrate electrode. Also, the glow discharge functions to activate the hydrogen causing it to react with the silicon, and be incorporated into the deposited silicon film. The activated hydrogen also coordinates with the dangling bonds of the silicon to form mono, di, and trihydrides.

In another preferred embodiment, amorphous silicon layer 140 is formed by chemical vapor deposition (CVD), such as plasma-enhanced CVD (PECVD) with silane gas at 200 to 450 degrees C. The preferred thickness of the amorphous silicon layer 140 is about 50 Å to 500 Å.

Figure 1E:
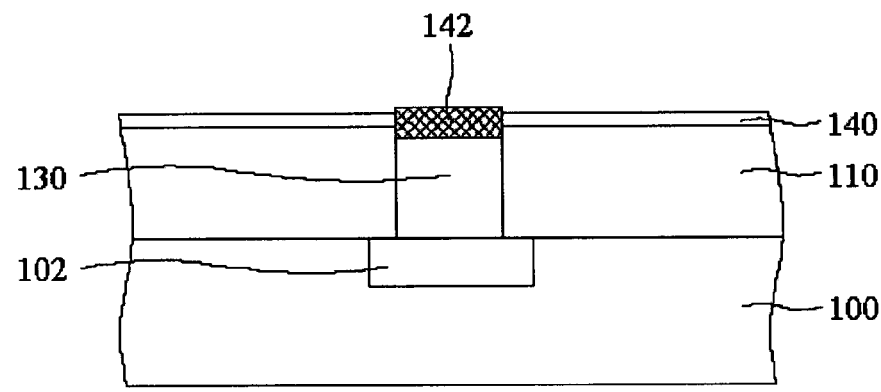

The semiconductor substrate 110 is then subjected to an inert gas-containing ambience at a temperature of about 150 degrees C. to about 450 degrees C. to form a copper silicide layer (CuSi$_x$) 142 between the surface of the copper plug 130 and the above amorphous silicon layer 140, as shown in FIG. 1E. Preferably, the substrate 110 is subjected in a furnace or a rapid thermal annealing (RTA) chamber for copper silicide formation.

Figure 1F:
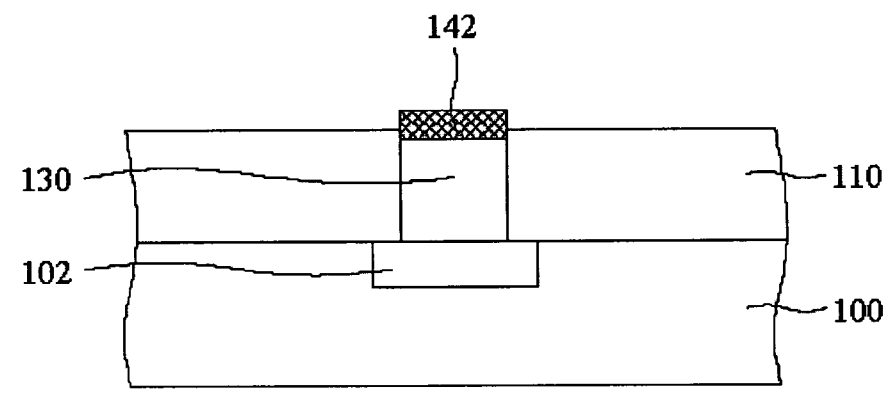

The un-reacted silicon layer 140 is then removed to expose the dielectric layer 110, as FIG. 1F shows. The copper silicide 142 serves as a capping layer of copper interconnects, which improves the adhesion between the copper or copper alloy plug 130 and above layers. Thus, the capped copper silicide layer 142 will not peel in the subsequent process and consequently improves the reliability of the semiconductor device.

Figure 1G:
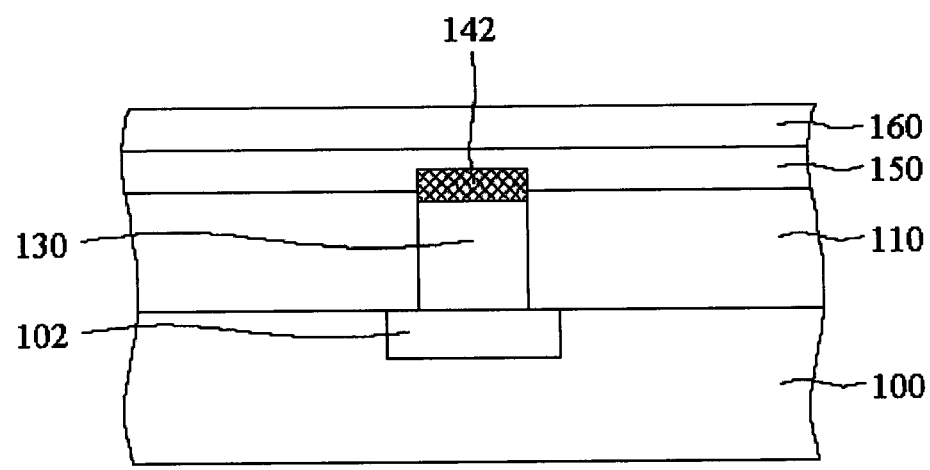

In FIG. 1G, a diffusion barrier layer 150 is preferably deposited on the surface of the substrate 110 by PECVD with a thickness of 200 Å to 2000 Å, covering the copper silicide layer 142 and the dielectric layer 110. The diffusion barrier layer 150 can be SiN, SiC, SiOC, SiOCN, silicon-rich oxide, carbon-containing silicon oxide, nitrogen-containing silicon oxide, or a combination thereof. An etch-stop layer 160 is optionally formed on the diffusion barrier layer 150 by PECVD at 300 degrees C. to 450 degrees C., which can be SiN, SiC, SiOC, and SiOCN, silicon-rich oxide, carbon-containing silicon oxide or nitrogen-containing silicon oxide. The etch-stop layer 160 serves as a stop layer for subsequent interconnect processes.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a semiconductor device, comprising:
    forming a dielectric layer overlaying a semiconductor substrate;
    forming an opening in the dielectric layer;
    embedding copper or copper alloy into the opening;
    forming a silicon layer on the copper or copper alloy by sputtering;
    reacting the silicon layer with the underlying copper or copper alloy to form a copper silicide layer capping the surface of the copper or copper alloy;
    removing un-reacted portions of the silicon layer; and
    forming a diffusion barrier layer overlaying the copper silicide.

2. The method as claimed in claim 1, wherein the dielectric layer comprises a low-k material having k value less than 3.2.

3. The method as claimed in claim 1, wherein the dielectric layer comprises organic low-k material, CVD low-k material, a combination of organic low-k material and CVD low-k material, carbon-containing silicon oxide, nitrogen-containing silicon oxide, FSG, SiC, SiOC or SiOCN.

4. The method as claimed in claim 1, wherein the width of the opening is less than 900 Å.

5. The method as claimed in claim 1, wherein the thickness of the embedded copper or copper alloy is less than 4000 Å.

6. The method as claimed in claim 1, wherein the silicon layer comprises amorphous silicon.

7. The method as claimed in claim 2, wherein the thickness of the silicon layer is 50 to 500 Å.

8. The method as claimed in claim 1, wherein the copper or copper alloy is formed by the steps of:
    depositing a copper seed layer in the opening; and
    electro-chemical plating or electroless plating the copper or copper alloy on the copper seed layer.

9. The method as claimed in claim 1, wherein the copper or copper alloy is formed by chemical vapor deposition.

10. The method as claimed in claim 1, wherein the copper silicide layer is formed by subjecting the semiconductor substrate to an inert gas-containing ambience at a temperature of about 150 degrees C. to about 450 degrees C.

11. The method as claimed in claim 1, wherein the diffusion barrier layer comprises silicon-rich oxide, SiN, SiC, SiOC, SiOCN, carbon-containing silicon oxide or nitrogen-containing silicon oxide.

12. The method as claimed in claim 1, further comprising a step of: forming an etch-stop layer overlaying the diffusion barrier layer.

13. The method as claimed in claim 12, wherein the etch-stop layer comprises silicon-rich oxide, SiC, SiOC, SiON, SiOCN, carbon-containing silicon oxide or nitrogen-containing silicon oxide.

14. The method as claimed in claim 12, wherein the silicon layer is formed on the copper or copper alloy by chemical vapor deposition.

* * * * *